United States Patent [19]

Zommer

[11] 4,441,117
[45] Apr. 3, 1984

[54] MONOLITHICALLY MERGED FIELD EFFECT TRANSISTOR AND BIPOLAR JUNCTION TRANSISTOR

[75] Inventor: Nathan Zommer, San Jose, Calif.

[73] Assignee: Intersil, Inc., Cupertino, Calif.

[21] Appl. No.: 287,497

[22] Filed: Jul. 27, 1981

[51] Int. Cl.³ .......................................... H01L 27/02
[52] U.S. Cl. ...................................... 357/43; 357/89
[58] Field of Search ................................ 357/41, 43

[56] References Cited

U.S. PATENT DOCUMENTS

| 3,461,360 | 8/1969 | Barson et al. | 357/34 |
| 4,089,022 | 5/1978 | Asai et al. | 357/43 |
| 4,199,774 | 4/1980 | Plummer | 357/43 |
| 4,315,307 | 2/1982 | Jacquart | 357/43 |
| 4,344,081 | 8/1982 | Pao et al. | 357/43 |

Primary Examiner—Gene M. Munson
Attorney, Agent, or Firm—Spensley, Horn, Jubas & Lubitz

[57] ABSTRACT

A semiconductor device is provided comprising a monolithically merged field-effect transistor and bipolar junction transistor. The device has a semiconductor region with a base contact and a gate electrode such that a signal applied to the base contact causes the device to function as a bipolar junction transistor, while a signal applied to the gate electrode causes the device to function as a field-effect transistor. In this manner, the mode of operation may be chosen so as to achieve the most desired operating characteristics.

4 Claims, 6 Drawing Figures

MONOLITHICALLY MERGED FIELD EFFECT TRANSISTOR AND BIPOLAR JUNCTION TRANSISTOR

BACKGROUND OF THE INVENTION

1. Field of the Invention

The present invention relates to transistors and more particularly to monolithic transistor devices.

2. Description of the Prior Art

A circuit designer often has to make compromises when deciding which of the various transistor technologies available to select for a particular application. For example, in switching applications, bipolar junction transistors (hereinafter bipolar transistors or BJT's) are generally faster than metal-oxide semiconductor field-effect transistors (MOSFET's). However, BJT's are slower than MOSFET's for power transistor switching applications. A MOSFET can switch from the "on" state to the "off" state typically in less than 20 nanoseconds. The bipolar transistor may need longer than one microsecond to switch since it is usually driven deep into saturation in power applications.

Because of the relatively slow switching speeds of bipolar transistors, circuits utilizing them can experience higher switching losses when switched at high frequencies across high voltages. These switching losses occur as the transistor switches between its low voltage, high current "on" state and its high voltage, low current "off" state. During this transition, there is a finite period of time in which there is both a significant current flow in the device and a significant voltage drop across the device such that a substantial amount of power is dissipated. Generally, the slower the device, the larger the switching losses.

An additional disadvantage of a bipolar transistor is evident when it is connected to an inductive load. The bipolar transistor often fails (i.e., continues to conduct) after it is attempted to turn it off due to the so-called "reverse-biased second breakdown" phenomenon. When the base of the transistor is reverse-biased in order to turn it off, the voltage across the device suddenly rises due to the inductive load. Since there are still stored carriers in the device during the turn-off period, it continues to conduct current for a few microseconds until all the stored carriers are removed. Thus, there is conduction at a high voltage, resulting in a very large instantaneous power dissipation. This reverse-biased second breakdown can occur at voltages below that which cause avalanche breakdowns.

MOSFET devices have their own disadvantages associated with them. The MOSFET generally has a significantly lower transconductance (gm) than the bipolar transistors of similar chip size. That is, for a given change in the input voltage, a greater change in the output current is produced in the bipolar transistor than in the MOSFET. As an example, a base drive voltage of only two volts can typically drive a bipolar transistor deep into saturation, whereas in order to produce a similarly high current in a MOSFET, an input voltage of from six to eight volts is often required. Furthermore, the MOSFET generally has a higher "on resistance" (RON) than a bipolar of similar chip size. As a consequence, the MOSFET will typically dissipate a greater amount of power at a given current than the bipolar transistor.

Thus, it is seen that both bipolar and MOSFET devices have their own particular advantages and disadvantages, particularly with respect to power applications. Hence, a designer selecting a transistor for one characteristic, such as switching speed, will incur disadvantages in other characteristics such as "on resistace" and transconductance.

It is an object of the present invention to provide a monolithically merged semiconductor device obviating, for practical purposes, the above-mentioned limitations of prior devices.

SUMMARY OF THE INVENTION

The present invention eliminates the dilemma of having to choose between a bipolar or MOSFET device by providing a merged semiconductor device which can operate either as a bipolar transistor or a MOSFET, depending upon the requirements of the load. Thus, where high switching speed is necessary the MOSFET portion of the device will be switched, and where high transconductance and low RON is necessary the bipolar portion of the device will be switched. The switching mode may therefore be chosen so as to insure lowest switching losses.

A preferred embodiment of the invention provides a monolithically merged field-effect transistor and bipolar junction transistor device comprising a first semiconductor region of a first conductivity type, a second semiconductor region of the first conductivity type and a third semiconductor region of a conductivity type opposite to that of the first and second regions. The third region is disposed between first and second regions and has a contact electrically connected to the third region forming a transistor base. The third region also has an electrode insulatively coupled to the third region forming a transistor gate whereby a signal applied to the base contact causes the device to function as a bipolar transistor and a signal applied to the gate electrode causes the device to function as a field-effect transistor.

BRIEF DESCRIPTION OF THE DRAWINGS

Other objects and advantages of the invention are more particularly set forth in the following detailed description and in the accompanying drawings of which.

DETAILED DESCRIPTION OF THE DRAWINGS

Figure 1:
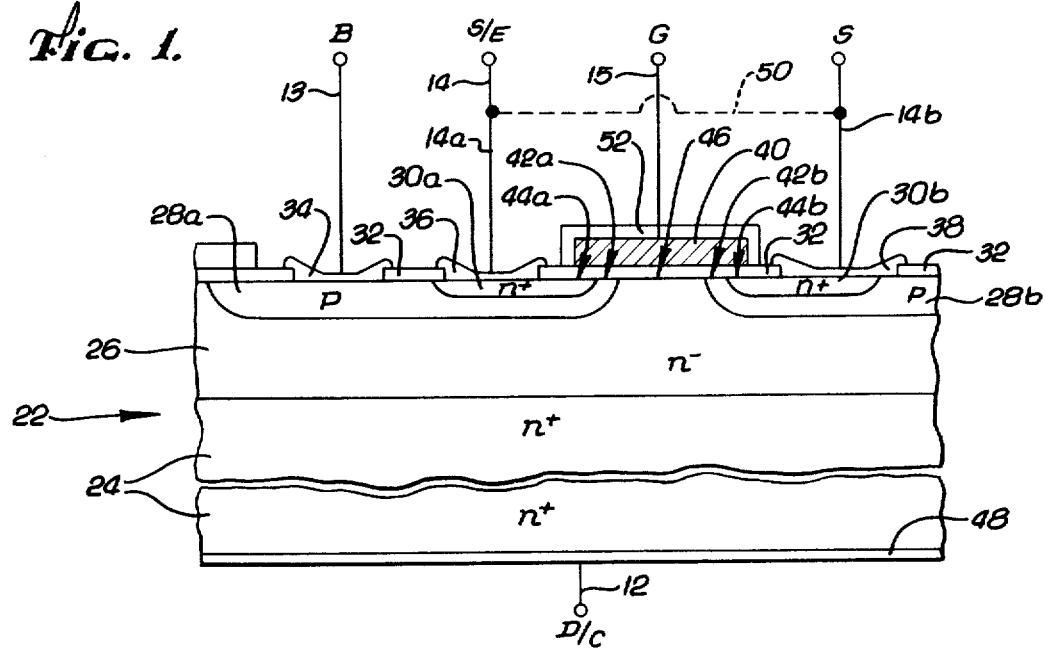
FIG. 1 is a cross-sectional view of a semiconductor device employing a preferred embodiment of the present invention.
Figure 2:
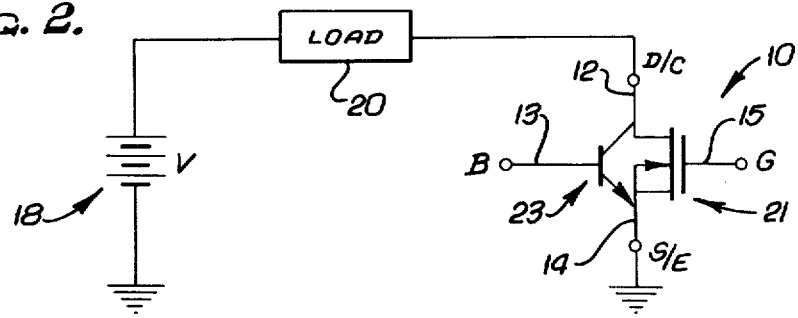
FIG. 2 is an circuit diagram employing a configuration of the embodiment of FIG. 1 as a circuit element.

The illustrated embodiment of the present invention will be described in connection with a merged monolithic device 10 as shown in FIGS. 1-6. An equivalent circuit of the device 10 is represented in FIG. 2 as having four terminals 12-15. A voltage supply 18 is connected through a load 20 to the terminal 12 with the device 10 grounded at the terminal 14. With the terminals 13 and 15 maintained at zero volts, negligible current is conducted by the device from the terminal 12 to the terminal 14. If a voltage signal of sufficient magnitude (typically 2 volts or greater) is applied to the terminal 15, the device 10 will function as a switch and turn on allowing current to flow from the terminal 12 to terminal 14. Alternatively, a voltage (or current) signal of a sufficient magnitude (typically 0.7 volts or greater) applied to the terminal 13 will turn on the device 10 allowing the current to flow from the terminal 12 to terminal 14. As will be seen from the following detailed description of the device 10, a signal applied to the terminal 15 designated "G" (for gate) operates the device 10 in a "MOSFET mode" with the device functioning with characteristics of a MOSFET device as represented by MOSFET transistor 21. With a signal applied to the terminal 13 designated "B" (for base), the device performs in a "bipolar mode," represented by the bipolar transistor (BJT) 23. Accordingly, the device may be operated in either the MOSFET mode, bipolar mode or both modes depending upon the transistor characteristic or characteristics required for the particular application.

A cross-sectional view of a monolithically merged vertical power MOSFET and bipolar transistor in silicon is shown in FIG. 1. This figure shows an n channel MOSFET and NPN BJT. Similarly if one replaces the n-type regions by p-type regions, a p channel MOSFET and pnp BJT are created. The MOSFET transistor 21 of the device 10 has a drain 22 which comprises a silicon substrate 24 which has been heavily doped with impurities to be a particular conductivity type. In this embodiment, the substrate has been doped with "donor" ions so that the substrate is n-type, that is, the majority carriers are electrons which have a negative charge. More particularly, the substrate has been designated n+, which indicates heavy doping.

The drain 22 includes an epitaxial layer 26 grown on top of the substrate 24. The epitaxial layer 26 is lightly doped to be the same conductivity type as the substrate as indicated by the n− designation shown in FIG. 1 As will be clearly seen below, the substrate 24 and epitaxial layer 26 also form the collector of the npn bipolar junction transistor 23 (FIG. 2) of the device 10 and thus the drain and collector are merged. (Hence, the region 22 will be referred to alternatively as the drain 22, the collector 22 or the drain/collector 22.)

The MOSFET transistor 21 further has two channel regions 28a and 28b formed by diffusing "acceptor" ions into the n-epitaxial layer 26 so that the regions 28a and 28b are p-type regions. In p-type regions, the majority carriers are "holes" which have a positive charge. Hence, p-type regions are a conductivity type opposite to that of the drain. The p region 28a will be seen to also function as the base region of the npn bipolar transistor 23 so that the base and one of the channel regions are also merged.

An n+ region 30a is diffused into the p region 28a and a second n+ region 30b is diffused into the p region 28b. The regions 30a and 30b are the same conductivity type as the drain and thus are an opposite conductivity type as the regions 28a and 28b. The region 30b functions as a source region of the MOSFET transistor 21 while the region 30a functions as the emitter region of the bipolar 23 as well as another source region of the MOSFET 21. Hence, the emitter and one of the source regions of the device 10 are merged as well.

A silicon dioxide dielectric layer 32 is formed over the surfaces of the regions 26, 28a, 28b, 30a and 30b. A window in the silicon dioxide layer 32 is opened up over the p region 28a to allow a layer of aluminum to be deposited to form a base contact 34 electrically connecting the connector or terminal 13 to the p region 28a. Similarly, a source/emitter contact 36 is formed through a window in the layer 32 electrically connecting the "S/E" connector 14a to the source/emitter region 30a, and a source contact 38 is formed electrically connecting source connector 14b to the second source region 30b.

A plate or electrode 40 comprised of n+ polycrystalline silicon is disposed on the silicon dioxide layer 32 and is positioned over the surfaces 42a and 42b of the p regions 28a and 28b, respectively. The electrode 40 also overlaps the surface 44a of the n+ source region 30a and the surface 46 of the n− drain region 26 contiguous to gate surface 42a to form a first channel region. Similarly, the electrode 40 overlaps the surface 46 of the n-drain region 26 and the surface 44b of the n+ source region 30b contiguous to the surface 42b to form a second channel region.

As seen in FIG. 1, the electrode 40 is insulatively coupled by the layer 32 over the surfaces 44a and 44b, 42a and 42b, and 46. The gate terminal 15 is connected to the electrode 40 through a window in a second silicon dioxide layer 52 deposited and/or grown over the electrode 40. Finally, the "D/C" connector 12 of the drain/collector 22 is electrically connected by a contact 48 to the n+ substrate 24.

FIG. 2 shows the voltage supply 18 connected through the load 20 to the drain/collector terminal 12 of the device 10 with the source/emitter terminal 14 returned to ground. In this configuration, the device 10 functions as a switch having two input leads 13 and 15 by which the device may be turned on, i.e., the switch closed. An input voltage signal of two volts or more applied to the gate terminal 15 induces an electric field in the silicon dioxide layer 32 between the channel region 28a and the gate electrode 40. This field attracts the electron minority carriers toward the surface region 42a in the channel region 28a, allowing current to flow from the source region 30a through the channel to the drain region 26. In this manner, the device 10 functions as n channel MOSFET transistor.

The second source connector 14b can be connected to the source/emitter contact 14a as indicated by the connecting line 50 shown in phantom in FIG. 1. Since electrons are also attracted to the surface region 42b of channel region 28b, conduction also occurs in the region 28b channel between the source region 30b and the drain region 26. This in effect doubles the current carrying capability of the MOSFET 21.

Alternatively, a voltage signal of 0.7 volts or greater applied to the base terminal 13 will enable the device 10 to function as the npn bipolar junction transistor 23 with the region 28a functioning as the base region, the region 30a functioning as the emitter, and the region 22 functioning as the collector. Thus the emitter 30a injects electrons into the base 28a where they are swept across the reverse-biased base/collector junction into the collector 22.

To illustrate one manner in which the dual mode capabilities of the present invention may be utilized, the following example is given. In a pulse-width-modulation of the power applied to the load 20, the MOSFET 21 of the device 10 could be turned on first by applying a suitable voltage to the gate 15. By initially activating the MOSFET, its fast switching capabilities are taken advantage of. With the MOSFET turned on, the voltage applied across the npn transistor 23 is greatly reduced. The bipolar transistor is turned on after a slight delay by applying a suitable voltage or current to the base 13. This enables the lower conduction losses and the higher transconductance of the bipolar transistor 23 to be realized. During this period, the device 10 is operated with both the MOSFET 21 and bipolar transistor 23 functioning, with the bipolar conducting most of the current.

It has been found that the conduction losses using the device of FIG. 1 were reduced by a factor of more than five as compared to a power MOSFET alone of equal chip area. Moreover, the switching losses are less than if a bipolar transistor alone were used, since the bipolar 23 is not turned on until after the MOSFET 21 has been turned on, resulting in a lower voltage across the bipolar when it is turned on. Similarly, the bipolar 23 is switched off first and a short time later the MOSFET is turned off so that the switching losses are again reduced as compared to a bipolar transistor alone. Additionally, it has been found that the bipolar 23 turns off faster than a bipolar alone because the MOSFET 21 provides an additional vehicle for removing stored carriers from the base. Thus, the device of FIG. 1 provides a switch having both the high switching speed of a MOSFET and the high current carrying capability of a bipolar transistor.

Figure 3:
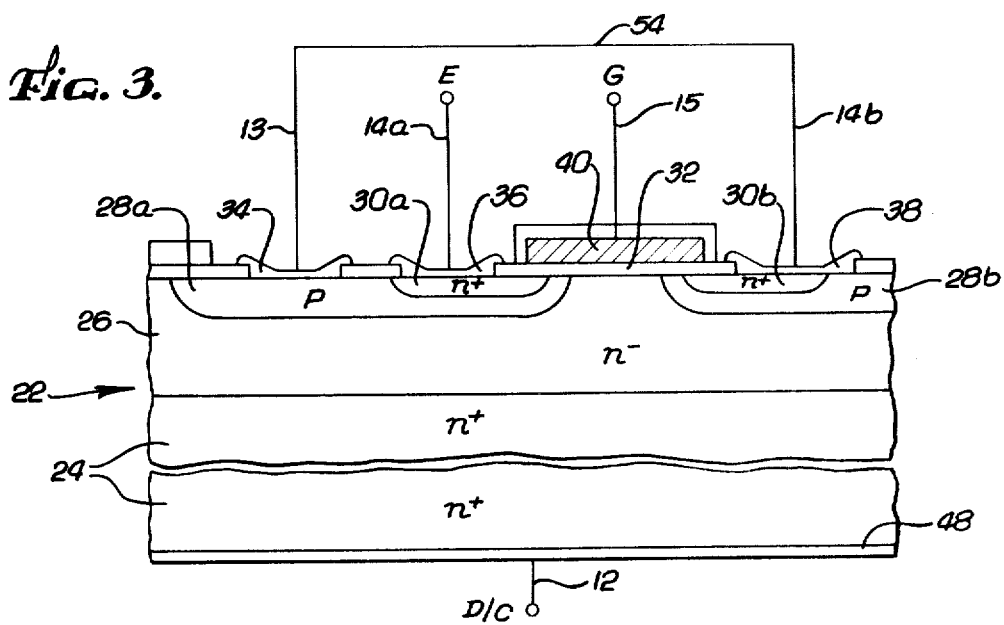
FIG. 3 is a cross-sectional view of an alternate embodiment of the invention.
Figure 4:
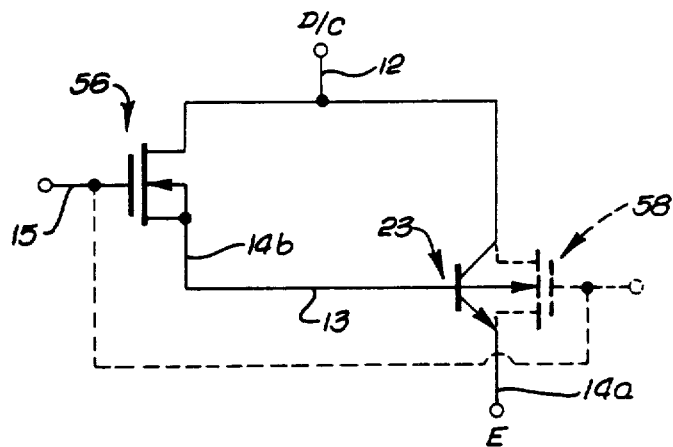
FIG. 4 is an equivalent circuit diagram of the embodiment of FIG. 3.

An alternative configuration of the invention is shown in FIGS. 3 and 4. In this configuration, the second source terminal 14b of the MOSFET is tied to the base terminal 13 of the npn bipolar transistor by a connecting line 54. The equivalent circuit of the configuration of FIG. 3 is shown in FIG. 4. The device resembles a bipolar Darlington connected transistor pair except that the first stage is a MOSFET 56 coupled to the second stage bipolar transistor 23.

With reference to FIG. 3, the first stage MOSFET 56 comprises the second source 30b, the gate region 28b and the drain 22. The second stage bipolar comprises the emitter 30a, the base 28a and the collector 22 (the region 22 being shared by the first stage MOSFET and second stage bipolar).

It should be noted that in this configuration, since the two sources 30a and 30b are not tied together as in the configuration shown in phantom in FIG. 2, there is functionally a second MOSFET 58 in the device 10 comprising the source 30a, the channel region 28a, which shares the electrode 40 with the MOSFET 56, and the drain 22. This second MOSFET 58 functions in parallel with the bipolar 23 but is indicated in phantom in the equivalent circuit of FIG. 4, since the bipolar 23 conducts most of the current.

It is known that a bipolar transistor generally requires more energy to turn on than a MOSFET. In order to circumvent this problem, the configuration shown in FIGS. 3 and 4 utilizes the MOSFET 56 of the device 10 to drive the bipolar transistor 23 of the device 10. In addition, a configuration such as that shown in FIGS. 3 and 4 has been found to have a much higher transconductance than a MOSFET transistor alone. This configuration thus combines the ease of drive of a MOSFET with the current handling capabilities of a bipolar transistor.

Figure 5:
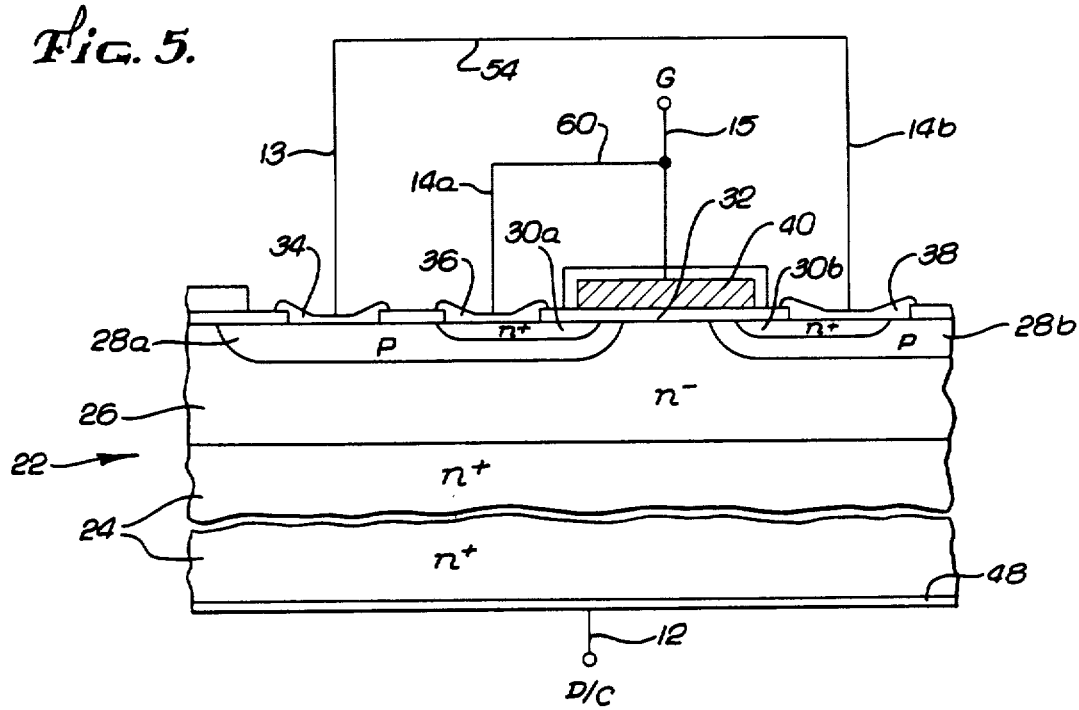
FIG. 5 is a cross-sectional view of still another embodiment of the invention.
Figure 6:
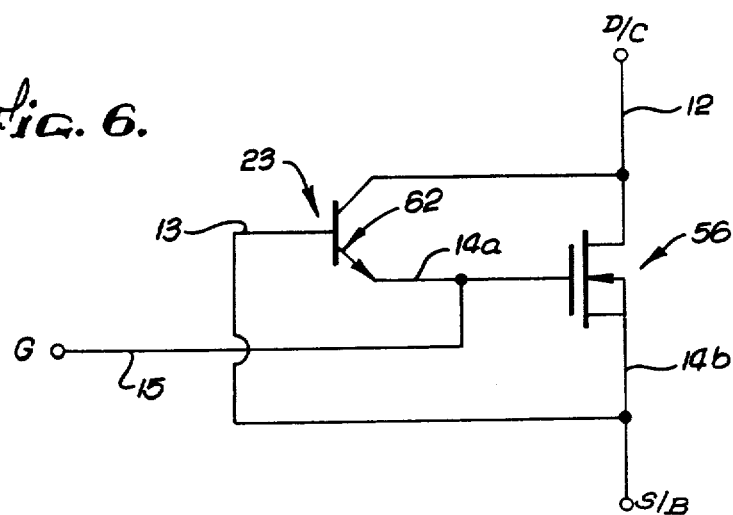
FIG. 6 is an equivalent circuit diagram of the embodiment of FIG. 5.

Still another configuration of the invention is shown in FIGS. 5 and 6. In addition to tying the second source terminal 14b of the MOSFET to the base terminal 13 of the bipolar transistor of the device shown in FIG. 5, the source/emitter terminal 14a, designated 'S/B' in FIG. 6, is tied to the gate terminal 15 by means of line 60. The equivalent circuit of the configuration of FIG. 5 is shown in FIG. 6. This configuration functions as a Zener-gate protected MOSFET. The Zener diode 62 comprises the junction between the n+ emitter region 30a and the base p region 28a of the npn transistor 23 of the device shown in FIG. 5. As shown in FIGS. 5 and 6, the cathode (or region 30a) is connected to the gate of the MOSFET 56 with the anode (or the p region 28a) connected to the source of the MOSFET 56.

The silicon dioxide layer of the gate may be damaged by an excessive voltage on the gate terminal 15. An accumulation of charge on an open-circuited gate may result in a large enough field to "punch through" the dielectric. In normal operation of this gate-protected MOSFET, the Zener diode is open and has no effect upon the circuit. However, if the voltage at the gate becomes excessive, then the diode breaks down and the gate potential is limited to a maximum value equal to the Zener voltage.

As can be seen above, the present invention provides a device which can, in its various configurations, utilize advantages of both bipolar junction and field-effect transistor technologies and yet minimize their disadvantages.

It will, of course, be understood that modifications of the present invention and its various aspects will be apparent to those skilled in the art. Accordingly, the scope of the invention should not be limited by the particular embodiments and specific constructions herein described, but should be defined only by the appended claims and equivalents thereof.

Various features of the invention are set forth in the following claims.

I claim:

1. A monolithically merged field-effect transistor and bipolar junction transistor device comprising:
    a first semiconductor region of a first conductivity type;
    a second semiconductor region of said first conductivity type;
    a third semiconductor region of a second conductivity type opposite to that of said first and second regions, said third region being disposed between said first and second regions;
    a fourth semiconductor region of said first conductivity type;
    a fifth semiconductor region of said second conductivity type disposed between said fourth region and said first region;
    a base contact electrically connected to said third region;
    a gate electrode insulatively coupled to said third and fifth regions;
    an electrical connection connecting said fourth and third regions;
    wherein said first region is a monolithically merged drain and collector, said second region is a monolithically merged source and emitter, said third region is a monolithically merged channel region and base, said fourth region is a second source and said fifth region is a second channel region, and wherein a signal applied to said gate electrode causes said device to function as a Darlington-connected field effect transistor and bipolar junction transistor pair.

2. A monolithically merged field-effect transistor and bipolar junction transistor device comprising:
- a first semiconductor region of a first conductivity type;
- a second semiconductor region of said first conductivity type;
- a third semiconductor region of a second conductivity type opposite to that of said first and second regions, said third region being disposed between said first and second regions;
- a fourth region of said first conductivity type;
- a fifth region of said second conductivity type disposed between said fourth region and said first region;
- a base contact electrically connected to said third region;
- a gate electrode insulatively coupled to said third and fifth regions;
- an electrical connection connecting said fourth region to said base contact; and
- an electrical connection connecting said second region to said gate electrode;
- wherein said first region is a monolithically merged drain and collector, said second region is a monolithically merged source and emitter, said third region is a monolithically merged channel region and base, said fourth region is a second source and said fifth region is a second channel region, and wherein the junction between said second and third regions forms a Zener protection diode electrically connected across said gate electrode and said second source of said field-effect transistor.

3. A dual mode monolithically merged transistor device comprising:
- a merged drain and collector region;
- a merged source and emitter region;
- a merged base and channel region disposed between said merged drain and collector region and said merged source and emitter region;
- a second source region;
- a second channel region disposed between said second source region and said merged drain and collector region;
- a gate electrode insulatively disposed over the surface of said merged base and channel region and said second channel region to form a field-effect transistor gate;
- a contact electrically connected to said merged base and channel region to form a bipolar junction transistor base; and
- an electrical connection from said second source region to said base contact to form a Darlington-connected field-effect transistor and bipolar junction transistor pair.

4. A dual mode monolithically merged transistor device comprising:
- a merged drain and collector region;
- a merged source and emitter region;
- a merged base and channel region disposed between said merged drain and collector region and said merged source and emitter region;
- a second source region;
- a second channel region disposed between said second source region and said merged drain and collector region;
- a gate electrode insulatively disposed over the surface of said merged base and channel region and said second channel region to form a field-effect transistor gate;
- a contact electrically connected to said merged base and channel region to form a bipolar junction transistor base;
- an electrical connection from said second source region to said base contact; and
- a further electrical connection from said merged source and emitter region to said gate;
- whereby the junction between said merged source and emitter region and the base forms a Zener protection diode electrically connected across said gate and said second source region of said field-effect transistor.

* * * * *